US008635972B2

(12) United States Patent
Roca I Cabarrocas et al.

(10) Patent No.: US 8,635,972 B2
(45) Date of Patent: *Jan. 28, 2014

(54) DEVICE FOR FORMING A FILM BY DEPOSITION FROM A PLASMA

(75) Inventors: Pere Roca I Cabarrocas, Villebon sur Yvette (FR); Pavel Bulkin, Villebon sur Yvette (FR); Dmitri Daineka, Palaiseau (FR); Patrick Leempoel, Brussels (BE); Pierre Descamps, Rixensart (BE); Thibault Kervyn De Meerendre, Brussels (BE)

(73) Assignees: Ecole Polytechnique, Palaiseau (FR); Dow Corning Corporation, Midland, MI (US)

( * ) Notice: Subject to any disclaimer, the term of this patent is extended or adjusted under 35 U.S.C. 154(b) by 598 days.

This patent is subject to a terminal disclaimer.

(21) Appl. No.: 12/447,854

(22) PCT Filed: Oct. 26, 2007

(86) PCT No.: PCT/EP2007/009304
§ 371 (c)(1),
(2), (4) Date: Jul. 29, 2009

(87) PCT Pub. No.: WO2008/052704
PCT Pub. Date: May 8, 2008

(65) Prior Publication Data
US 2010/0071621 A1 Mar. 25, 2010

(30) Foreign Application Priority Data
Nov. 2, 2006 (EP) .................................... 06301116

(51) Int. Cl.
C23C 16/00 (2006.01)
C23F 1/00 (2006.01)
H01L 21/306 (2006.01)
H01J 7/24 (2006.01)
H05B 31/26 (2006.01)

(52) U.S. Cl.
USPC ...... 118/723 MR; 118/723 MA; 156/345.42; 315/111.41

(58) Field of Classification Search
USPC ..... 118/723 MR, 723 MA, 723 AN, 723 MP, 118/723 MW; 156/345.33, 345.42, 345.41; 315/111.21, 111.41
See application file for complete search history.

(56) References Cited

U.S. PATENT DOCUMENTS 4,957,061 A * 9/1990 Ando et al. .................. 118/719
5,032,202 A * 7/1991 Tsai et al. ................ 156/345.42

(Continued)

FOREIGN PATENT DOCUMENTS

EP 0233613 8/1987
EP 0487114 5/1992

(Continued)

OTHER PUBLICATIONS

Daineka, D., et al., "Control and Monitoring of Optical Thin Films Deposition in a Matrix Distributed Electron Cyclotron Resonance Reactor," European Physical Journal, Applied Physics EDP Sciences France, vol. 28, No. 3, Dec. 2004, pp. 343-346.

(Continued)

*Primary Examiner* — Rakesh Dhingra
(74) *Attorney, Agent, or Firm* — Leason Ellis LLP

(57) ABSTRACT

A plasma excitation device is described for use in depositing a film on a substrate from a plasma formed by distributed electron cyclotron resonance. The device comprises a microwave antenna having an end from which microwaves are emitted, a magnet disposed in the region of the said antenna end and defining therewith an electron cyclotron resonance region in which a plasma can be generated, and a gas entry element having an outlet for a film precursor gas or a plasma gas. The outlet is arranged to direct gas towards a film deposition area situated beyond the magnet, as considered from the microwave antenna.

6 Claims, 7 Drawing Sheets

(56) References Cited

U.S. PATENT DOCUMENTS

| | | | |
|---|---|---|---|
| 5,125,358 A * | 6/1992 | Ueda et al. | 118/723 MR |
| 5,429,685 A | 7/1995 | Saito et al. | |
| 5,536,914 A | 7/1996 | Pelletier et al. | |
| 5,666,023 A | 9/1997 | Pelletier | |
| 5,863,338 A * | 1/1999 | Yamada et al. | 118/719 |
| 6,407,359 B1 | 6/2002 | Lagarde et al. | |
| 2002/0022349 A1 | 2/2002 | Sugiyama et al. | |
| 2003/0194508 A1 | 10/2003 | Carpenter et al. | |
| 2004/0247948 A1 | 12/2004 | Behle et al. | |

FOREIGN PATENT DOCUMENTS

| | | |
|---|---|---|
| EP | 1075168 | 2/2001 |
| GB | 2083701 | 3/1982 |
| JP | 05-314918 | 11/1993 |
| JP | 10081968 | 3/1998 |
| WO | WO-2008/052703 | 5/2008 |
| WO | WO-2008/052705 | 5/2008 |
| WO | WO-2008/052706 | 5/2008 |
| WO | WO-2008/052707 | 5/2008 |
| WO | WO-2008/052708 | 5/2008 |
| WO | WO-2008/053271 | 5/2008 |

OTHER PUBLICATIONS

Daineka, D., et al., "High density plasma enhanced chemical vapour deposition of thin films" European Physical Journal—Applied Physics, vol. 26, No. 1, Apr. 2004, pp. 3-9, XP002462386.

"Compact Microwave Plasma Source" IBM Technical Disclosure Bulletin, IBM Corp. New York, US, vol. 35, No. 5, Oct. 1, 1992, pp. 307-308, XP000312985 ISSN; 0018-8689.

Bulkin, P., et al., "Plasma enhanced chemical vapour deposition of silica thin films in an integrated distributed electron cyclotron resonance reactor" Preparation and Characterization, Elsevier Sequoia, NL, vol. 308-309, Oct. 31, 1997, pp. 63-67, XP004524338 ISSN: 0040-6090.

Jes Asmussenjr et al: "The Design and Application of Electron Cyclotron Resonance Discharges" IEEE Transactions on Plasma Science, IEEE Service Centre, Piscataway, JN, US, vol. 25, No. 6, Dec. 1997, XP011044935 ISSN: 0093-3813.

Sakudo N. et al: "Development of hybrid pulse plasma coating system" Surface and Coatings Technology Elsevier Switzerland, vol. 136, No. 1-3, Feb. 2, 2001, pp. 23-27, XP002427492 ISSN: 02578972.

Awazu K et al: "Films formed by hybrid pulse plasma coating (HPPC) system" AIP Conference Proceedings AIP USA, No. 576, 2001, pp. 955-598, XP002427493 ISSN: 094-243X.

Bulkin P et al: "Deposition of silicon alloys in an integrated distributed electron cyclotron resonance reactor: Oxide, nitride, oxinitrides, and multilayer structures" Journal of Vacuum Science and Technology A.Vacuum, Surfaces and Films, American Institute of Physics, New York, NY, US, vol. 20, No. 2, Mar. 2002, pp. 338-343, PX012005960 ISSN: 0734-2101.

Girard G et al, "Matrix-distributed ECR-PECVD for high-rate deposition of silica for applications in integrated optics" Proceedings of the SPIE—The International Society for Optical Engineering SPIE—Int. Soc. Opt. Eng USA, vol. 4944, 2003, pp. 62-71, PX002436134 ISSN: 0277-786X.

Shing Y H et al: "Electron Cyclotron Resonance Microwave Plasma Deposition of A-SI:H and ASIC: H Films" Solar Cells, Elsevier Sequoia SA, Lausanne, CH, vol. 30, No. ¼, May 1, 1991, pp. 391-401, XP000243420.

Plais F et al: "Low Temperature Deposition of SIO2 by Distributed Electron Cyclotron Resonance Plasma-Enhanced Chemical Vapor Deposition" Journal of the Electrochemical Society, Electrochemical Society, Manchester, New Hampshire, US, vol. 139, No. 5, May 1, 1992, pp. 1489-1495, XP000355387ISSN: 0013-4651.

Lagarde, T, et al., "Determination of the EEDF by Langmuir Probe diagnostic in a plasma excited at ECR above a multipolar magnetic field", Plasma Sources Sci. Technol. 10, 181-190, 2001.

Moisan & Pelletier, "Microwave Excited Plasmas,"Elsevier, 1992, Appendix 9.1 pp. 269-271.

Fontcuberta, A., et al., "Structure and hydrogen content of polymorphous silicon thin films studied by spectroscopic ellipsometry and nuclear measurements" Physical Review B 69,125307/1-10, 2004.

Rafat, N. et al., "The limiting efficiency of band gap graded solar cells" Solar Energy Materials & Solar Cells, 55(1998) 341-361.

Foelsch, J., et al., Conference Record of the IEEE Photovoltaic Specialists Conference (1996) 25th 133-1136.

Dalal, V. et al., "Improvements in stability of a-silicon solar cells through the use of band gap grading" Conference Record of IEEE Photovoltaic Specialists Conference (1993), 23rd 806-20.

Suzuki et al, "Radio-frequency biased microwave plasma etching technique: A method to increase SiO2 etch rate", J Vac. Sci. Technol. B 3(4), 1025-1033, Jul./Aug. 1985.

Bechu, S., et al., "Multi-Dipolar Plasmas for Plasma-Based Ion Implantaion & Deposition," Surface & Coatings Technology, vol. 186, No. 1-2, Aug. 2, 2004, pp. 170-176.

Bardos, L. et al., "Microwave Surfatron System for Plasma Processing," Journal of Vaccum Science & Technology: Part A, AVS/AIP, vol. 14, No. 2, Mar. 1, 1996, pp. 474-477.

\* cited by examiner

DEVICE FOR FORMING A FILM BY DEPOSITION FROM A PLASMA

CLAIM OF PRIORITY

This application is a U.S. national phase application under 35 U.S.C. §371 of International Patent Application No. PCT/EP2007/009304 filed Oct. 26, 2007, and claims the benefit of priority of EP Patent Application No. 06301116.7 filed Nov. 2, 2006. The International Application was published in English on May 8, 2008 as WO 2008/052704.

FIELD OF INVENTION

This invention relates to a method for forming a film by deposition from a plasma on to a work surface. More particularly, it concerns the use of microwave energy to produce the plasma by electron cyclotron resonance. One area of particular interest is in depositing a film of amorphous silicon (a-Si:H) by dissociation of a silane, for example $SiH_4$, $Si_2H_6$ or a higher order of oligomer, in a process known as plasma-enhanced CVD (chemical vapor deposition). Other precursor gases which can be used to deposit amorphous silicon, or amorphous silicon alloys, include molecules in which silicon is present in combination with one or more of carbon, oxygen, or nitrogen, optionally together with hydrogen. An example of a silicon alloy is a structure of the type denoted by $SiO_xN_y$. Further, silicon-containing gases may be used together with other gases, for example germane, or gases not containing silicon may be used to deposit other films. One area of particular interest as regards the use of amorphous silicon films is in devices for converting solar energy into electrical power. Such amorphous silicon material can also find use in electronic applications such as TFT for display. As used herein, the term "amorphous silicon" denotes hydrogenated amorphous silicon, a-Si:H. For use in the areas just mentioned, some hydrogen must be present, typically 3-20%, to passivate the dangling bonds which are defects.

The invention is also believed to be applicable to the use of other precursor gases to deposit other materials in amorphous form, for example the use of germane to deposit a-Ge:H. It is further believed to be applicable to the deposition of microcrystalline materials such as µc-Si, µc-Ge and to that of DLC (diamond-like carbon).

BACKGROUND OF THE INVENTION

In the technical field of exciting a plasma to electron cyclotron resonance (hereinafter abbreviated to "ECR"), resonance is obtained when the frequency of gyration of an electron in a static or quasi-static magnetic field is equal to the frequency of the applied accelerating electric field. This resonance is obtained for a magnetic field B at an excitation frequency f which is related to B by the following relationship:

$$B = 2\pi m f/e \quad (1)$$

wherein m and e are the mass and the charge of an electron.

When exciting a plasma at electron cyclotron resonance frequency electrons revolve in phase with the electric field and continuously gain energy from the external excitation source where the ECR condition (1) is met such as to reach the threshold energy necessary for dissociating or ionizing the gas. To satisfy this condition, it is necessary firstly that the electron remains trapped in the magnetic field lines, i.e. that its radius of gyration is small enough with respect to the static magnetic field gradient for the electron to see a substantially constant magnetic field during its gyration, and secondly that the frequency of gyration remains large relative to the frequency of collision between electrons and neutral elements such as atoms and/or molecules. In other words, the best conditions for exciting a plasma to electron cyclotron resonance are expected to be obtained when simultaneously the gas pressure is relatively low and the excitation frequency f is high, which also means that the magnetic field intensity B must be high.

A major difficulty with conventional divergent ECR is that it is not possible to produce a plasma whose density is substantially uniform over a large area. This means that it cannot be used, for example, to deposit a substantially uniform layer of material on a work surface of large size. To overcome this problem, a technique has been developed which is known as distributed electron cyclotron resonance (DECR), which employs an apparatus in which a plurality of plasma excitation devices is formed into a network, with the devices collectively generating a plasma whose density is substantially uniform at the work surface. The individual plasma excitation devices are each constituted by a wire applicator of microwave energy, having one end connected to a source for producing microwave energy and having an opposite end fitted with at least one magnetic dipole for creating at least one surface having a magnetic field that is constant and of an intensity corresponding to electron cyclotron resonance. The dipole is mounted at the end of the microwave applicator in such a manner as to ensure that electrons accelerated to electron cyclotron resonance oscillate between the poles so as to create a plasma diffusion zone situated on the side of the dipole that is remote from the end of the applicator. The individual excitation devices are distributed relative to one another and in proximity with the work surface so as to create together a plasma that is uniform for the work surface.

Such a DECR apparatus is described in U.S. Pat. No. 6,407,359 (corresponding to EP-1075168), and more detailed discussion of the apparatus described therein is given below, with reference to drawings. As is apparent from those drawings, excitation devices, as viewed from the substrate, take the form of a generally rectangular array, by which we include also the particular case where the rectangle is a square, and such an apparatus is therefore sometimes referred to as matrix DECR (MDECR) apparatus. It is to be understood, however, that the present invention could also be applied to a DECR apparatus where the excitation devices were arranged in a non-rectangular two-dimensional network, for example in a hexagonal network or where there are two parallel lines of devices, with the devices in one line being offset with respect to one another. An example of a hexagonal array is given in "Determination of the EEDF by Langmuir probe diagnostic in a plasma excited at ECR above a multipolar magnetic field", T. Lagarde, Y. Arnal, A. Lacoste, J. Pelletier, Plasma Sources Sci. Technol. 10, 181-190, 2001. The devices could also be disposed as a circular, part-circular, or near-circular array. It should be noted that in some work done by the present inventors, depositions have been carried out with a central plasma excitation device being surrounded by three or six devices, the surrounding devices having the polarity of their magnets being oppositely disposed to the magnet of the central device and being arranged in a triangular or hexagonal array respectively.

Furthermore, the invention can be applied to a DECR apparatus which is not of an MDECR type. Thus, for example, it is applicable to a DECR reactor which, historically, preceded the MDECR type, and which has a cylindrical shape and uses long antennas and magnets that extend from the top to the bottom of the cylinder. Such arrangement is described in "Microwave Excited Plasmas" by Michel Moisan and Jacques Pelletier, Elsevier, 1992, and would be suitable for homogeneously coating a cylindrical substrate such as a tube or an object which is characterized by a dimension (length, radius) which is small as compared to the plasma ambipolar mean free path (See above reference, Appendix 9.1 page 269-271). This object can have a flat surface lying in the central part of the plasma and oriented perpendicular to the axis of the cylinder.

Unlike most divergent ECR reactors, DECR reactors employ only a single chamber, which serves both as a plasma chamber and a deposition chamber. This allows direct decomposition of the precursor gas by the plasma without the use of an additional and specific plasma gas. The substrate is not located in the plasma or directly in the intense magnetic field, which prevents the unintentional bombardment of the growing film by hot electrons and ions. The plasma is generated in each of the MW-ECR zones, in close proximity to the antennas, and in particular close to the magnet generating the ECR zone.

The creation of a network of MW-ECR antennas has the benefit of allowing the plasma region to be expanded, and of the generation of a homogeneous flow of species towards the substrate. FIG. 3 of the accompanying drawings shows a plasma created by four antennas.

In DECR the use of a plasma gas different from the film precursor gas is not essential and a film precursor gas can be used alone, without an additional plasma gas. In such cases the film precursor gas decomposes in the vicinity of the antennas and diffuses toward the substrate to deposit and form the film. During this "travel" secondary reactions may occur between the plasma-generated species and un-dissociated gas. For instance, where the precursor gas is $SiH_4$, hydrogen radicals generated by the decomposition of $SiH_4$ can react with un-dissociated $SiH_4$ to form $SiH_3$ radicals, which are believed to be the most important radicals required for the deposition of high quality films.

However, although not essential, a plasma gas can be used in DECR, in addition to the film precursor gas. Examples of such plasma gases are $H_2$, Ar and He. It is desirable that these plasma gases are excited or decomposed by the plasma prior to reacting with the film precursor gas. Such a requirement is complex to achieve with the conventional way of injecting the gases into a DECR reactor, particularly if the production of a large area plasma is required for the deposition of a homogeneous film on a very large area.

SUMMARY OF THE INVENTION

The present invention is directed to a plasma excitation device, a plurality of which elements can be combined in a DECR apparatus, each of which devices comprises means for injecting a gas in an advantageous manner, whether a plasma gas, a film precursor gas or a mixture of a plasma gas and a film precursor gas, the last mentioned possibility being of particular interest in the deposition of microcrystalline silicon or other microcrystalline material. Attention is drawn to our copending application filed on the same date as the present application and entitled "Method and apparatus for forming a film by deposition from a plasma" (our reference G28331EP (European Patent Application No. 06301115.9)) for a discussion of the way in which the quality of films deposited by a DECR process, and the deposition rate, can be improved by proper selection of location at which the film precursor gas is introduced and the direction in which the introduced gas is directed.

According to the invention there is provided a plasma excitation device, for use in depositing a film on a substrate from a plasma formed by distributed electron cyclotron resonance, the element comprising a microwave antenna having an end from which microwaves are emitted, a magnet positioned in the region of the said antenna end and defining therewith an electron cyclotron resonance region in which a plasma can be generated, and a gas entry element having an outlet for a film precursor gas or a plasma gas, the outlet being arranged to direct gas past the magnet, towards a film deposition area situated beyond the magnet, as considered from the microwave antenna.

As used herein, it is to be understood that the reference to the outlet being arranged to direct gas towards a film deposition area covers not only the case where the gas is aimed directly at that area, but also any case where that area is wholly within an angle defined between a line extending from the outlet, in the direction of gas flow therefrom, and a line which is at right angles thereto and passes through the outlet. Under such circumstances the gas flow emerging from the outlet will have a vector component towards all portions of the said area. Further, the requirement of the present invention that the gas outlet should be arranged to direct gas past the magnet is, of course, a reference to the effect of the gas outlet on the flow of gas after it has left the outlet, i.e. what is under consideration is the effect of the outlet in directing the gas from the outlet, past the magnet.

It may be noted that although EP-1075168 shows, in FIG. 6 thereof, a plasma excitation device in which the gas entry outlet is located in the plasma region, the location is very close to the lower boundary of that region, so that the effects achieved by the present invention are not obtained there. Indeed, FIG. 6 of EP-1075168 does not meet the requirement of the present invention that the gas outlet should direct gas past the magnet, since in that FIG. 6 the gas outlet is beyond the downstream end of the magnet and directs gas away form the magnet.

The invention is further described below with reference to the accompanying drawings, in which:

DETAILED DESCRIPTION OF THE INVENTION

Figure 1:
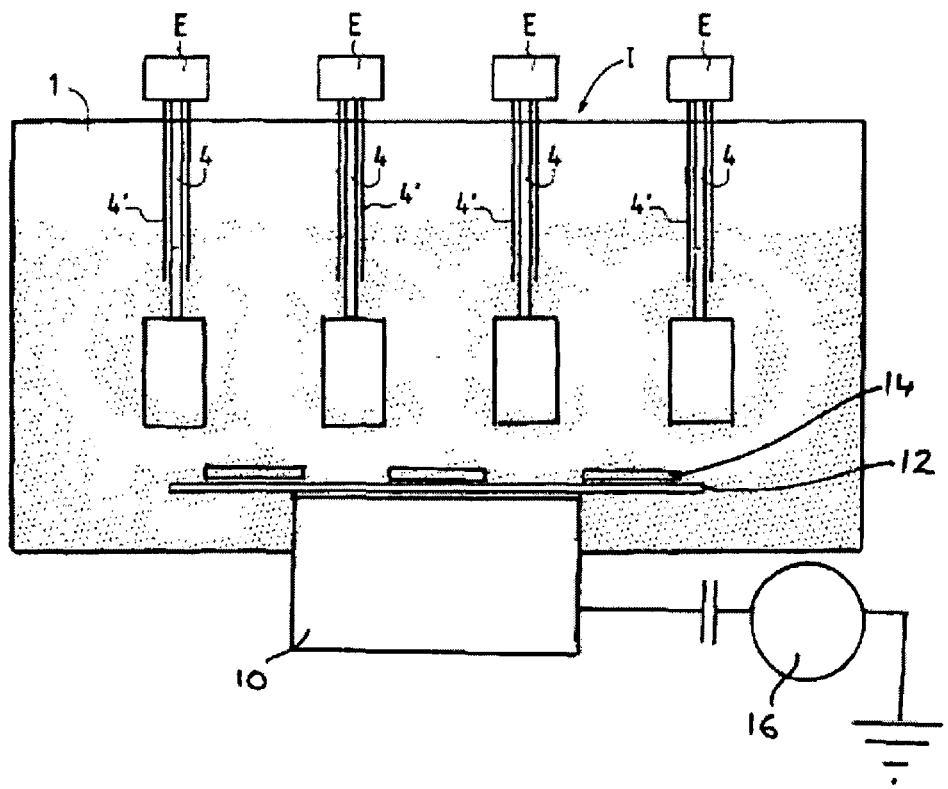
FIG. 1 is a diagrammatical elevation view showing a plasma production apparatus as described and shown in EP-1075168, omitting the means for introducing and extracting gas.
Figure 2:
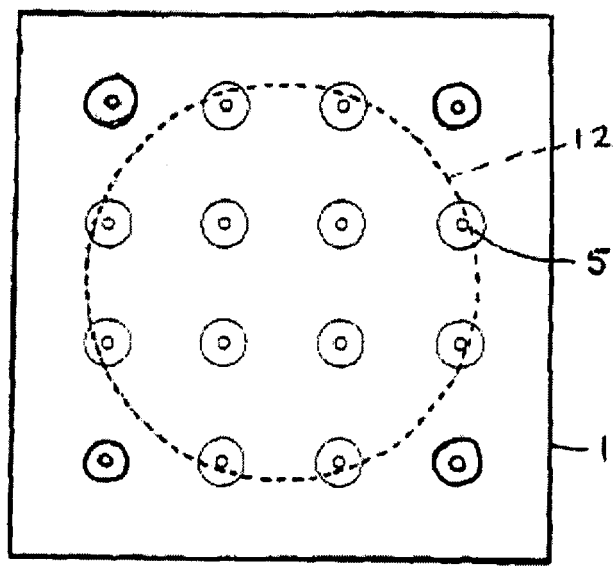
FIG. 2 is a plan view of the apparatus of FIG. 1.

FIGS. 1 and 2 show an apparatus for producing a plasma relative to a substrate on which a film is to be deposited. The apparatus comprises a sealed enclosure 1 represented diagrammatically and fitted with devices for admitting gas and for pumping gas out (not shown in FIG. 1), that enable the pressure of the gas that is to be ionized, or dissociated to be maintained at a desired value which, for example, can be about $10^{-2}$ to $2 \times 10^{-1}$ Pascals, depending on the nature of the gas and the excitation frequency. However, gas pressures less than $10^{-2}$ Pa (say down to $10^{-4}$ Pa, for example), or above $2 \times 10^{-1}$ Pa (say up to $5 \times 10^{-1}$ Pa, or even 1 Pa or more) can be used. For example, pumping can be carried out by a 1600 l/s Alcatel Turbo-molecular pump, which serves to extract gas from the enclosure.

Gas is admitted to the enclosure from an appropriate gas source, e.g. a cylinder of gas under pressure, under the control of a mass flow controller (MFC). The gas may, for example, comprise $SiH_4$ as a film precursor gas, or one of the other gases mentioned above in relation to the deposition of amorphous silicon. In addition to the film precursor there may also be introduced a non-reactive diluent gas, such as He, Ne or Ar, a reactive gas, such as hydrogen, nitrogen or oxygen, or a dopant gas such as diborane, trimethyl boron or phosphine. Typically any such other gases are introduced into the enclosure through the same port or ports as the film precursor gas, as a mixture therewith, but they could be introduced separately. The gas feeding system should ensure the appropriate flow of gases, which typically ranges from 1 to 1000 sccm (standard cubic centimeter per minute), into the reactor. The way in which gas is introduced in to the enclosure in the present invention is described further below with reference to the embodiments shown in FIGS. 4 to 7.

The plasma chamber is equipped with a substrate holder 10, which is shown as a fixed part of the apparatus. One function of the substrate holder is to heat the substrates to the required deposition temperature. This is typically between room temperature and 600° C., and in the case of the deposition of amorphous silicon is preferably in excess of 200° C., more preferably between 225° C. and 350° C. The temperature being referred to here is the actual substrate temperature, as opposed to the nominal substrate temperature which may be measured by measuring the temperature of the substrate holder. The significance of the distinction is discussed further in our co-pending application filed on the same date as the present application and entitled "Method for forming a film of amorphous silicon by deposition from a plasma" (our reference G27558EP (European Patent Application No. 06301114.2)).

A carrier plate 12, having thereon at least one substrate 14, and optionally a plurality of such substrates, is removably mounted on the holder 10, so that it can be brought into the chamber with substrates to be coated, and removed from the chamber with the substrates after they have been coated. However, alternatively the substrate can be glued directly on the substrate holder, using a thermally conductive glue. This improves thermal contact between the substrate and the substrate holder, which is otherwise difficult to achieve under low pressure conditions. This is discussed further in our co-pending application filed on the same date as the present application and entitled "Method for forming a film of amorphous silicon by deposition from a plasma" (our reference G27558EP (European Patent Application No. 06301114.2)). In this case the holder, with its substrates, needs to be introduced into the enclosure prior to the deposition process, and removed from it afterwards. If gluing is not used, one way to try to improve the heating of the substrate is to precede the low pressure film deposition step by a step in which the enclosure is filled with gas at a relatively high pressure (typically around 100-200 Pa). The high pressure gas provides thermal transfer across whatever gap may exist between the substrate and the heated holder, ensuring initial heating of the substrates. Another possibility is to place a thermally conductive carbon film between the substrate and the substrate holder. The substrate holder can be heated by circulating a hot fluid inside it, but heating could alternatively be achieved by electrical heating resistors embedded in the substrate holder. Alternatively, however, it is possible to heat the substrates directly, for example by using infrared lamps.

Another function of the substrate holder is to allow polarization of the substrate surface such as to control the energy of ions towards the substrate. Polarization can be achieved using either a source of RF voltage or using a DC voltage and requires the substrate holder to be electrically insulated from ground. Polarization is achieved by connecting the electrically insulated substrate holder to an appropriate RF or DC generator 16 with an adequate matching circuit in the case of RF polarization. When depositing on an insulating substrate, or on an insulating layer previously deposited on a substrate (which may or may not be insulating), the use of an RF generator is preferred. When depositing on a conductive substrate or on a conductive layer previously deposited on a substrate which may or may not be conductive, the bias can be applied by either an RF or DC generator with suitable electrical connection to the substrate surface. In a specific embodiment an RF-bias was applied using a 13.56 MHz Dressler generator connected to the substrate holder via an automatic tuning box. Even when using an RF generator, the resulting bias on the substrate surface comprises a DC bias component, as a result of conditions in the plasma. An explanation of how this occurs can be found, in the content of the description of a completely different plasma process, in Suzuki et al, "Radio-frequency biased microwave plasma etching technique: A method to increase $SiO_2$ etch rate", J. Vac. Sci. Technol. B 3(4), 1025-1033, July/August 1985.

The plasma production apparatus I has a series of individual plasma excitation devices E spaced apart from one another and located in the proximity of the substrates, so as to operate together to create a plasma that is uniform for the substrates. Each individual plasma excitation device E comprises an elongate microwave energy applicator 4. Each applicator 4 has one of its ends connected to a respective microwave energy source, which lies outside the enclosure 1. Alternatively, however, a single microwave energy source can feed microwaves to all the applicators 4, or there can be a plurality of energy sources fewer in number than the number of applicators. For example, an array of sixteen applicators can conveniently be fed by two 2.45 GHz microwave generators, each of 2 kW maximum power, and each feeding eight applicators via a power splitter and respective slug tuners. Each applicator 4 is advantageously in the form of a tube surrounded by a coaxial tube 4', thus enabling microwave energy to propagate to the free end thereof while avoiding radiating microwaves, and reducing microwave coupling between the applicators. In order to ensure proper transfer of the microwave energy into the plasma, each applicator is preferably equipped with a matching device that minimizes, or at least reduces, the reflected power.

Each microwave applicator 4 has its free end connected to at least one permanent magnet 5. Each magnet preferably has its magnetic axis parallel to the long axis of the magnet itself. In one particular form of this arrangement all the plasma excitation devices have their magnets oriented in the same direction (a monopolar configuration). i.e. all their north poles are at the top and all their south poles are at the bottom, or vice versa. In another, some of each pole are at the top and some of each pole are at the bottom (a multipolar configuration). An example of the latter is an array, where, viewed from one end as in FIG. 2, and passing along any given row or column of devices, one successively encounters poles of alternate polarity. Yet another example is where all the magnets in a given row (or column) have the same polarity, but the columns (or rows) are of alternative polarity. However, arrangements can also be used where the magnetic axes of the magnets are not parallel to the long axes of the magnets themselves, provided there are significant regions where the lines of the magnetic field are parallel to the propagation vector of microwaves. This is necessary in order to ensure the existence of significant regions where ECR damping can occur.

Reference is made herein to the "hot electron confinement envelope". The definition of "hot electron confinement envelope" required firstly a definition of "hot electron component zones". The hot electron confinement zones are those regions in which the hot (fast) primary electrons are trapped. These are regions in which the electrons oscillate between two adjacent magnet poles of opposite polarity, which could be two poles of a single magnet (hereinafter referred to as "intra-magnet poles") or poles of two adjacent magnets (hereinafter referred to as "inter-magnet poles"), in which the adiabatic approximation condition is met (Larmor radius is small with respect to the magnetic field gradient), and in which the electrons gain energy by crossing regions where the ECR coupling condition is met.

The magnets and the hot electron confinement zones define a hot electron confinement envelope. This is a volume which is the envelope of the array of magnets, expanded parallel to the magnetic axes of the magnets in both directions by the distance by which the inter-magnet zones (if any) extend beyond the ends of the magnets, and expanded perpendicular to the magnetic axes of the magnets in all directions by the distance by which the intra-magnet zones extend beyond the outward facing surfaces of the magnets.

Figure 3A:
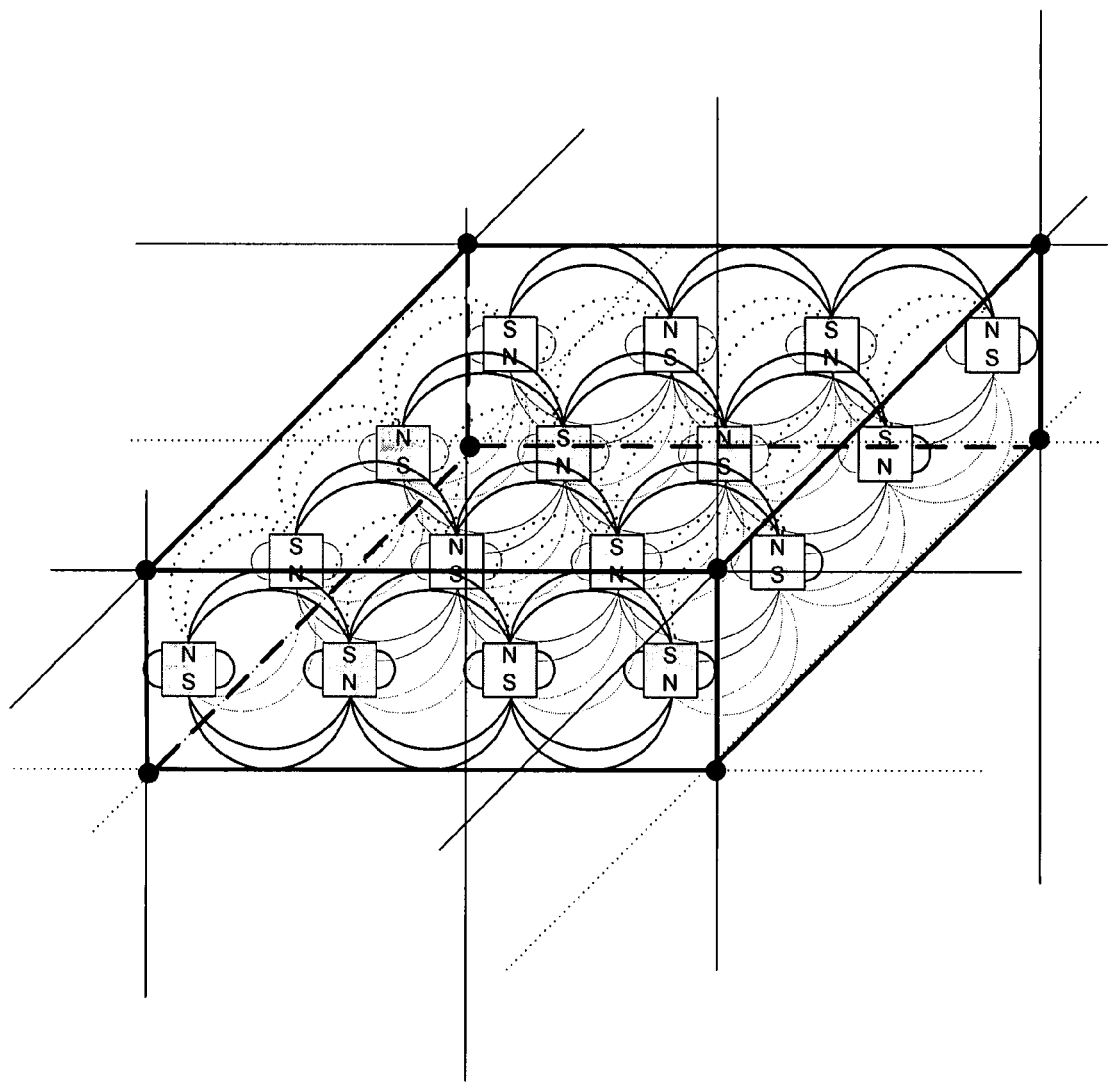
FIGS. 3a and 3b show the hot electron confinement envelope for two particular magnet configurations.
Figure 3B:
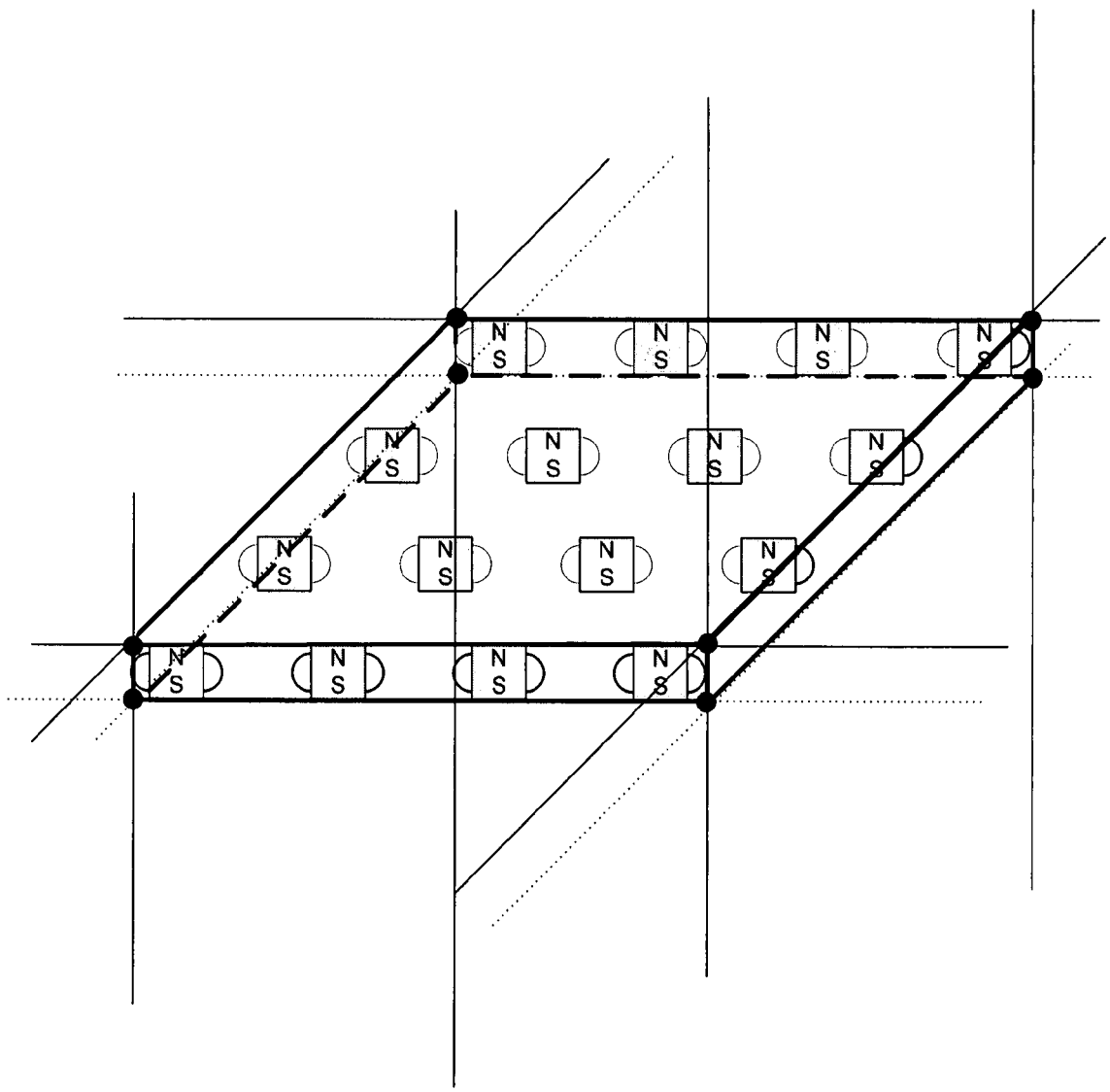

As mentioned above, FIGS. 3a and 3b show the hot electron confinement envelope for two particular magnet configurations. In each figure the envelope is indicated by the parallelepiped box drawn in bold lines. FIG. 3a shows the case of a wholly multipolar configuration, in which every magnet is oppositely disposed to each of its intermediate neighbours. FIG. 3b shows the case of a homopolar configuration, in which all magnets are identically orientated. Appropriate envelopes can be constructed for other magnet configurations, for example ones in which all the magnets in a given row have the same orientation, but adjacent rows are of opposite orientation to one another.

Figure 4:
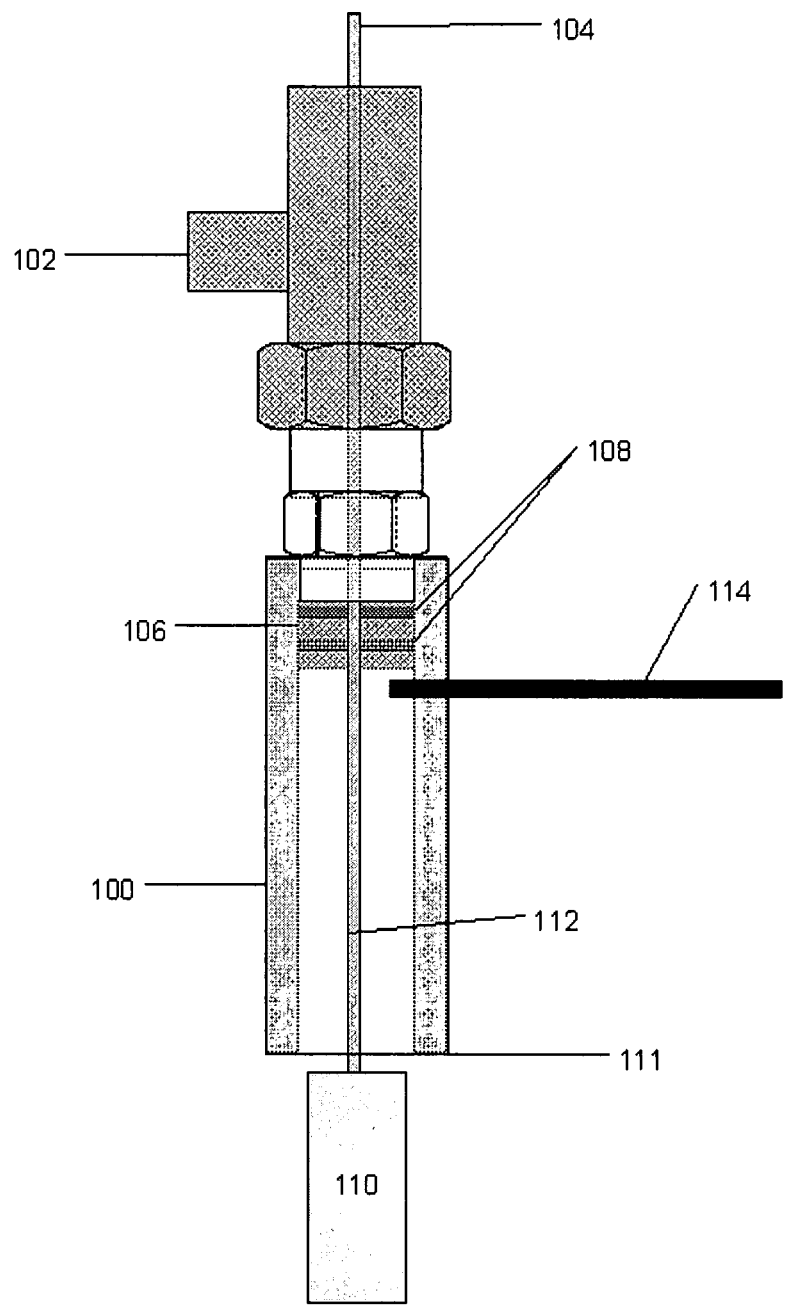
FIGS. 4 to 7 show four embodiments of plasma excitation device according to the present invention.

The embodiment of plasma excitation device shown diagrammatically in FIG. 4 comprises a hollow cylindrical tube 100 to which microwaves are fed via a connector 102. A plurality of such devices are disposed in an array, for example as shown in FIGS. 1 and 2, whereby to produce a plasma region enveloping the end portions of all the devices. Cooling liquid is fed to the upper end of the device via a port 104.

Within the upstream end of the tube 100 is a quartz window 106, the window having two annular grooves within which are located a pair of O-ring seals 108. Quartz is transparent to microwave radiation of the wavelength typically employed in such devices.

A permanent magnet 110 is mounted beyond the downstream open end 111 of the tube 100. Normally the magnet will have its magnetic poles at its ends, either with N at the end adjacent the open end 111 of the tube 100, and S at the end remote therefrom, as indicated, or with the N and S poles in the opposite configuration. The magnet is supported by a rod 112. Although not shown as such, the rod 112 is in fact a pair of coaxial tubes, and cooling liquid which has entered the port 104 flows down the tube, into a cavity within the magnet, and back up the annular space between the tubes, thereby cooling the magnet.

A gas entry line 114 extends from outside the chamber in which a plasma is to be generated and in which the element is situated, through the cylindrical wall of the tube 100, to introduce gas into the interior of the tube. The gas leaves the tube through its open end 111, and thus enters the interior of the chamber in the vicinity of the magnet 110. Also, it is to be noted that, assuming the substrate to be coated is located below the element, as seen in the view of FIG. 4, the initial direction of travel is towards the substrate. The plasma gas pressure in the interior of the tube 100 should be low enough to prevent plasma ignition therein.

Where no separate plasma gas is to be used, the gas fed into the tube 100 through the line 114 is a film precursor gas, e.g. a silane. When this leaves the open end 111 of the tube 100 it enters the reactor chamber in the heart of the plasma zone, and has to travel a significant distance through that zone on its way towards the substrate on which a film is to be formed. Introduction of the film precursor gas at this location is found to produce a high quality film, deposited at a high deposition rate. This is further discussed in our copending application filed on the same date as the present application and entitled "Method and apparatus for forming a film by deposition from a plasma" (our reference G28331EP (European Patent Application No. 06301115.9)).

Where a separate plasma gas is to be used, this plasma gas is fed through the line 114, and the film precursor gas may then be introduced into the reactor chamber at a separate location, preferably being directed towards the substrate to be coated. This is to be found to produce high quality film, deposited at a high deposition rate. However, at least when a microcrystalline material is to be produced, the plasma gas and precursor gas may both be introduced together via the line 114.

Figure 5:
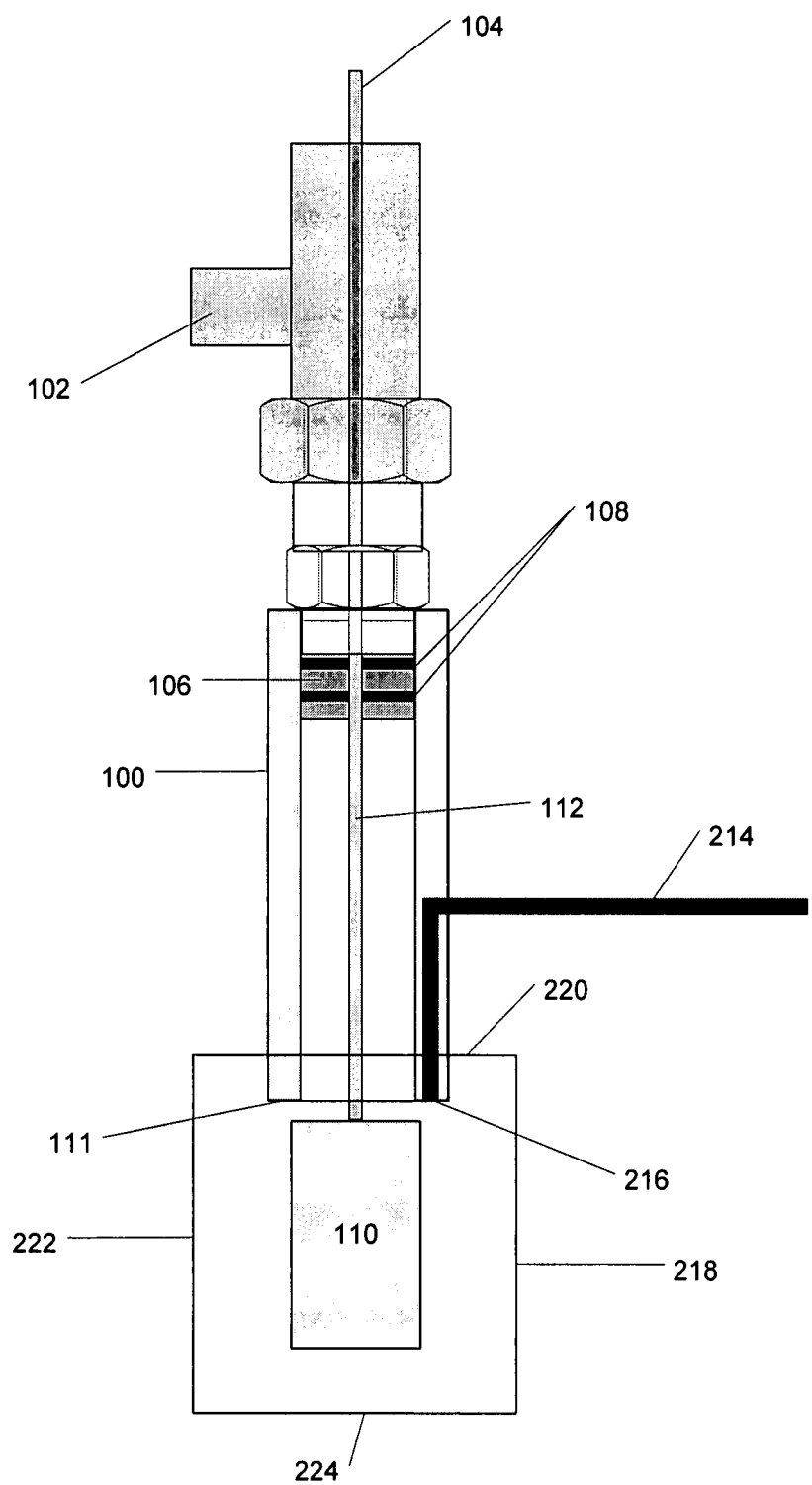

The embodiment shown in FIG. 5 differs from that shown in FIG. 4, in that it has a gas entry line 214 having a outlet 216 which is directed outwardly from the outer wall of the tube 100, adjacent the lower end 111 thereof. The device further comprises a tubular gas shield 218 having a closed upper wall 220, a peripheral wall 222 and an open end 224. The gas shield may be made of any suitably heat-resistant, non-magnetic material, for example quartz, ceramic or alumina, or a non magnetic metal (which will have the benefit of confining the microwave in the shield).

The embodiment of FIG. 5, although it has certain advantages by virtue of the gas shield, may also have the disadvantages of impeding electron movement and thereby reducing plasma density. This disadvantage, to the extent that it exists, could, however, be at least substantially overcome by using a single gas shield enveloping the region around the downstream ends of all the plasma excitation devices with which the reactor is provided.

Figure 6:
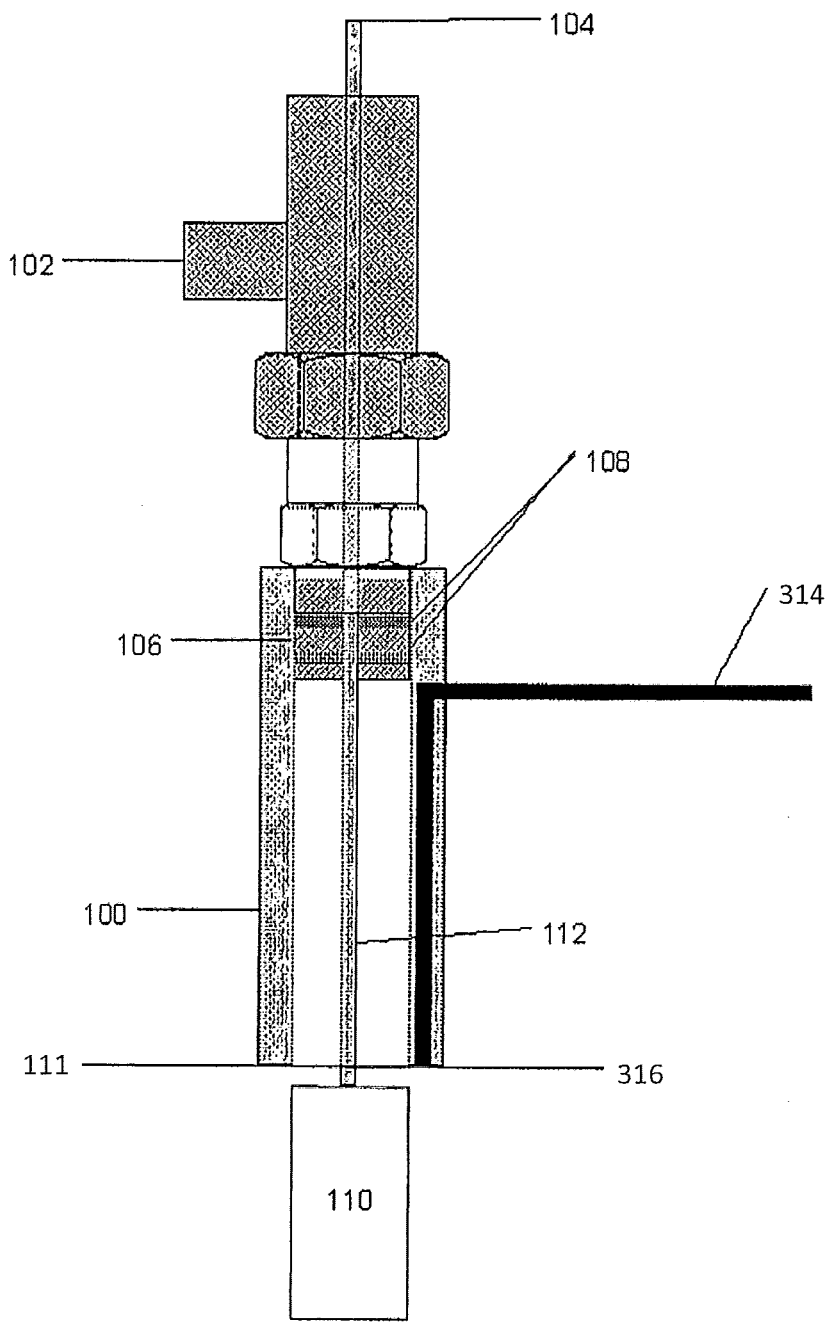

The embodiment of FIG. 6 resembles that of FIG. 4, in that it has no gas shield, but like FIG. 5, has its gas entry line, here denoted 314, having its downstream portion within the peripheral wall of the tube 100. Here, however, the outlet 316 of the line 314 is directed parallel to the longitudinal axis of the tube, and away from it, and thus towards the substrate on which the film is to be formed.

Figure 7:
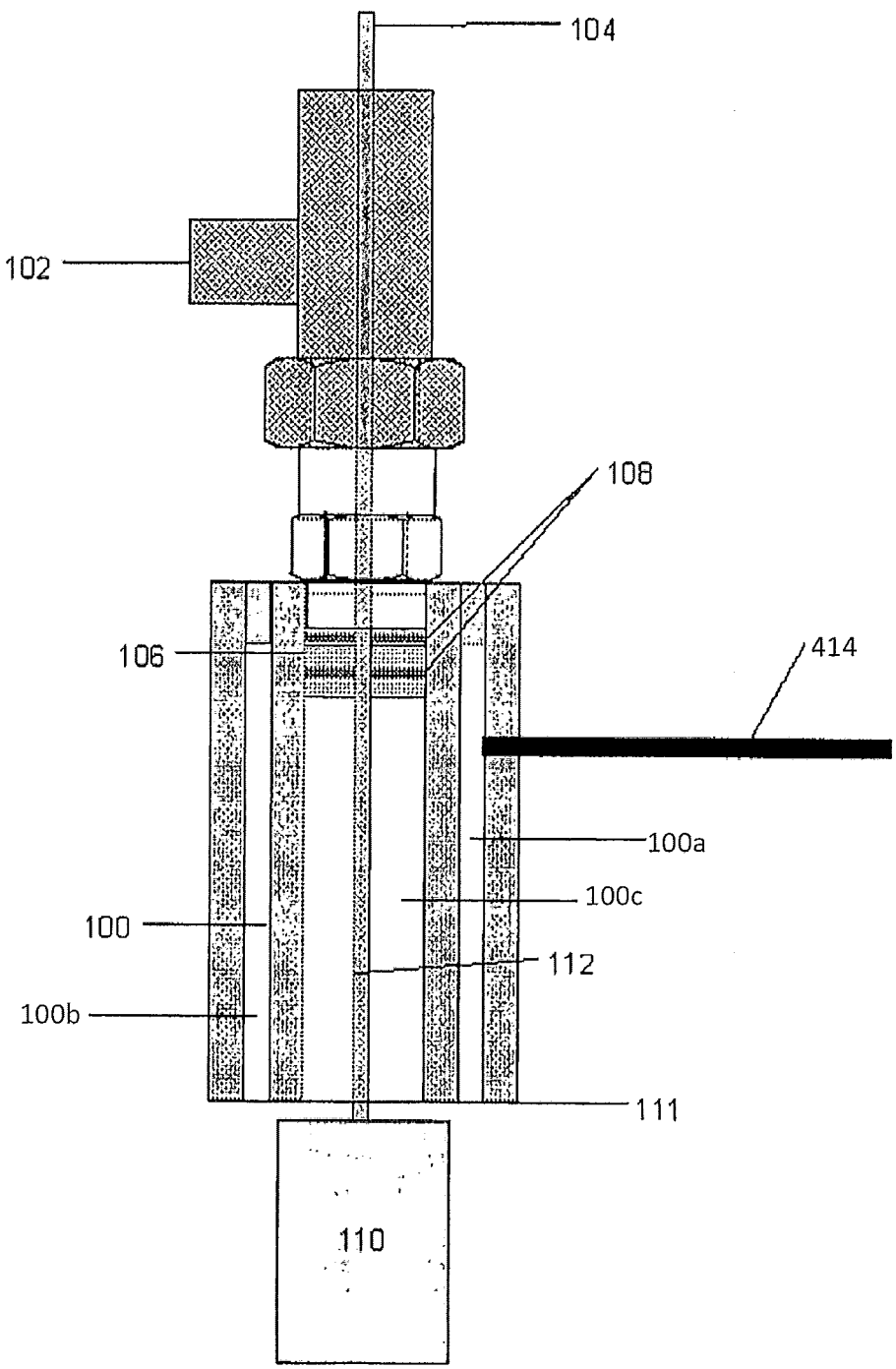

In the embodiment of FIG. 7, the tube 100 consists of an inner tube 100a and an outer tube 100b arranged coaxially with respect to one another and defining an annular passage 100c therebetween. The gas entry line, here denoted as 414, communicates with the passage 100c, and film precursor gas exits the passage 100a at its lower end, in a direction towards the substrate.

The invention claimed is:

1. A plasma excitation device, for use in depositing a film on a substrate from a plasma formed by distributed electron cyclotron resonance, comprising:
   a microwave antenna in the form of a tube having an end from which microwaves are emitted,
   a magnet disposed beyond the said antenna end and defining therewith an electron cyclotron resonance region in which a plasma can be generated, the magnet being disposed separate and spaced from said antenna end, and a gas entry element, provided by said tube in conjunction with a gas feeding line having its downstream portion, with an outlet, the downstream portion disposed within the peripheral wall of the tube, and which is arranged to introduce gas into said cyclotron resonance region, at the end of said microwave antenna that faces said magnet, wherein said outlet for a film precursor gas or a plasma gas is arranged above and facing said magnet in order to direct gas past said magnet, towards a film deposition area situated beyond said magnet, as considered from said microwave antenna, and wherein said outlet being disposed separate and spaced apart from said magnet.

2. The device according to claim 1, wherein the outlet is located in a hot electron confinement envelope, said hot electron confinement envelope comprising the magnet and regions in which hot primary electrons are trapped.

3. The device according to claim 1, wherein the outlet is located at or adjacent the microwave antenna end from which the microwaves are emitted.

4. The device according to claim 1, wherein the gas feeding line is arranged to introduce the gas into a region defined within a wall of the tube, said outlet communicating with said region.

5. The device according to claim 1, wherein the magnet is located so that its magnetic axis is substantially aligned with the direction of the microwave propagation from the antenna.

6. An apparatus for depositing a film on a substrate from a plasma, comprising:

an enclosure;

a plurality of plasma excitation devices dispersed within the enclosure, and a support for the substrate within the enclosure, said support allowing the heating and polarization of substrate, wherein each of the plasma excitation devices comprise:

a microwave antenna in the form of a tube having an end from which microwaves are emitted, a magnet disposed beyond said antenna end and defining therewith an electron cyclotron resonance region in which a plasma can be generated, the magnet being disposed separate and spaced from said antenna end, and a gas entry element, provided by said tube in conjunction with a gas feeding line having its downstream portion, with an outlet, the downstream portion disposed within the peripheral wall of the tube, and which is arranged to introduce gas into said cyclotron resonance region, at the end of said microwave antenna that faces said magnet, wherein said outlet for a film precursor gas or a plasma gas is arranged above and facing said magnet in order to direct gas past said magnet, towards a film deposition area situated beyond said magnet, as considered from said microwave antenna, and wherein said outlet being disposed separate and spaced apart from said magnet.

* * * * *